United States Patent [19]
Duffek et al.

[11] 3,947,867
[45] Mar. 30, 1976

[54] TWO PART PACKAGE FOR A SEMICONDUCTOR DIE

[75] Inventors: Edward F. Duffek; Ernest J. Funk, both of Cupertino; Alfred S. Jankowski, San Jose; Jack C. Lane, Saratoga; William L. Lehner, Los Altos Hills; Floyd F. Oliver, Los Altos; Mark R. Schneider, San Jose, all of Calif.

[73] Assignee: Signetics Corporation, Sunnyvale, Calif.

[22] Filed: Dec. 21, 1970

[21] Appl. No.: 99,904

[52] U.S. Cl. ................................................ 357/70
[51] Int. Cl.² ........................................... H01L 23/48
[58] Field of Search ............ 317/234 (5.4), 234 (5), 317/234 (6), 234 (3), 101; 174/DIG. 3; 357/70

[56] References Cited
UNITED STATES PATENTS 3,519,890  7/1970  Ashby .............................. 317/101
3,559,285  2/1971  Kauffman ........................ 29/630

*Primary Examiner*—Martin H. Edlow
*Assistant Examiner*—E. Wojciechowicz
*Attorney, Agent, or Firm*—Flehr, Hohbach, Test, Albritton & Herbert

[57] ABSTRACT

Semiconductor devices containing integrated circuits are attached directly to external package leads by pressing simultaneously a plurality of groups of leads against bonding pads on a plurality of face-up semiconductor dice and heating the composite structures. Solder bumps on the bonding pads contain hard pedestals which prevent the overlying leads from being pushed into the faces of the semiconductor devices while the solder on the solder bumps melts to form the bonds between the leads and the underlying semiconductor dice. The process for carrying out this operation lowers significantly the cost of each packaged semiconductor device and the resulting structure is more reliable than structures of the prior art.

1 Claim, 18 Drawing Figures

INVENTORS
EDWARD F. DUFFEK
ERNEST J. FUNK
ALFRED S. JANKOWSKI
JACK C. LANE
WILLIAM L LEHNER
FLOYD F. OLIVER
MARK SCHNEIDER

BY Alan H. MacPherson
ATTORNEY

INVENTORS
EDWARD F. DUFFEK
ERNEST J. FUNK
ALFRED S. JANKOWSKI
JACK C. LANE
WILLIAM L. LEHNER
FLOYD F. OLIVER
MARK SCHNEIDER

BY Alan H. MacPherson
ATTORNEY

INVENTORS
EDWARD F. DUFFEK
ERNEST J. FUNK
ALFRED S. JANKOWSKI
JACK C. LANE
WILLIAM L. LEHNER
FLOYD F. OLIVER
MARK SCHNEIDER

BY Alan H. MacPherson
ATTORNEY

INVENTORS
EDWARD F. DUFFEK
ERNEST J. FUNK
ALFRED S. JANKOWSKI
JACK C. LANE
WILLIAM L. LEHNER
FLOYD F. OLIVER
MARK SCHNEIDER

BY Alan H. MacPherson
ATTORNEY

INVENTORS
EDWARD F. DUFFEK
ERNEST J. FUNK
ALFRED S. JANKOWSKI
JACK C. LANE
WILLIAM L. LEHNER
FLOYD F. OLIVER
MARK SCHNEIDER

BY *Alan H. MacPherson*
ATTORNEY

INVENTORS
EDWARD F. DUFFEK
ERNEST J. FUNK
ALFRED S. JANKOWSKI
JACK C. LANE
WILLIAM L. LEHNER
FLOYD F. OLIVER
MARK SCHNEIDER

BY Alan H. MacPherson
ATTORNEY

TWO PART PACKAGE FOR A SEMICONDUCTOR DIE

BACKGROUND OF THE INVENTION

1. Field of the Invention

This invention relates to semiconductor devices and in particular to a process for bonding a semiconductor device directly to the leads from the package containing the device without the use of lead wires, and to the resulting structure.

2. Description of the Prior Art

One of the most expensive steps in the production of a semiconductor device, and in particular in the production of an integrated circuit, is electrically connecting the semiconductor chip to the leads from its package. Typically this is done by bonding the semiconductor chip to the bottom part of the package and then bonding lead wires from bonding pads (sometimes called contact pads) on the chip to the corresponding leads from the package. To form each connection between a bonding pad and the corresponding lead, a person must first direct a bonding tool to the pad and form a bond between the lead wire and the pad, and then direct the bonding tool to the package lead and bond the other end of the lead wire to this package lead. The formation of such electrical connections between the chip and the package leads is an expensive, time-consuming operation. After these bonding operations are completed, the top is placed on the package.

Automatic techniques to carry out this bonding have been proposed. One such technique places the semiconductor chip face down on the surface of a substrate having electrically-conductive package leads placed thereon. Bonding pads on the chip, which typically support solder bumps, are located above the ends of the package leads. Unfortunately, the fact that the solder bumps are face down and thus not visible makes it expensive to accurately align the bumps with the underlying leads and impossible to inspect visually the resulting bonds. Moreover, the thermal contractions of the package leads after the bumps have been melted and soldered to the package leads can induce thermal stresses in the device which reduce its reliability.

Another proposed technique places the semiconductor die onto package leads contained in a lead frame. An operator, using a split microscope showing both the bottom and top of the die, visually aligns the bumps on each die with the corresponding leads. The die and leads together are then heated to solder the die to the leads. Again, however, the leads are such that stresses are often induced in the bumps, leads or die after the leads have been soldered to the bumps. In addition, the operator must place each die onto its corresponding set of leads and then heat the die separately to form the bonds. Although not as time-consuming as having the operator form lead-wire connections between each die and its package leads, this is still an expensive and time-consuming operation.

SUMMARY OF THE INVENTION

This invention overcomes some of the disadvantages of the prior attempts to reduce the cost of electrically connecting semiconductor dice to package leads. The technique of this invention requires only an initial calibration by an operator and then each set of package leads is automatically aligned with the appropriate dice.

According to this invention, a plurality of semiconductor dice are simultaneously bonded to corresponding groups of package leads by first placing the dice in a jig with their bonding pads up so as to be visible. Then, a plurality of groups of package leads contained in a set of such leads are placed over the dice and the set is aligned so that regions of the terminal portions of the leads in each group of package leads are just above the bonding pads on a corresponding underlying die. The dice in the jig have the same spacings as the lead groups in the lead set. Weights are then placed over each group of package leads in the set thus forcing selected parts of the terminal portions of the leads into contact with the underlying bonding pads. The jig with the dice, leads, and weights is then heated thereby to form permanent electrical connections between the leads and the underlying bonding pads.

To relieve thermal stresses, each lead contains a selectively bent section. In one embodiment this bend is U-shaped but bends of other shapes are also used. Each bent section deforms to relieve thermal stresses which otherwise would remain in the associated bonding pad or in the underlying semiconductor die to decrease the reliability of the packaged semiconductor device.

The dice, with leads attached, are then encapsulated in a selected packaging material. In accordance with this invention, each packaged semiconductor die is then either used as it is or further packaged in a second packaging material. This allows great flexibility in the uses to which the method and structure of this invention are put.

In an alternative embodiment of this invention, the semiconductor device with the leads attached can be used as an extended lead device. Different metals or their alloys can be used for the extended leads. Thus, for example, nickel, copper or plated metals can be used for the leads. Then the leads can be attached directly to outside package connections.

During the formation of the electrical connections between the package leads and the semiconductor dice, the leads wet and pull the solder contained in the bonding pad solder bumps along the leads, thus preventing solder from falling onto the faces of the dice. The actual bonding between the package leads and the semiconductor dice is carried out in an inert or non-oxidizing atmosphere. Minimum oxidation occurs in this atmosphere and thus the package lead surface completely wets. The resulting bonds have high pull strength. The resulting package-lead, semiconductor-die structure is corrosion resistant as very small amounts of corrosion susceptible metal such as aluminum (only that contained in the pedestals of the solder-bumps) are exposed. The wetting of the package leads ensures that solder electrically contacts at least one side of each package lead and usually all sides of each package lead in a spherical ball.

Once a set of package leads has been aligned such that part of the terminal portion of each lead in each group of leads falls above a corresponding bonding pad on a given size semiconductor die, the operator does not have to realign each subsequent set of leads. Thus this process is fast and efficient. The cost of a package containing devices bonded to the package leads by the method of this invention is considerably beneath that of prior art packages.

DESCRIPTION OF THE DRAWINGS

FIG. 2c shows an alignment tool used to align a set of leads 10 (FIG. 1c) with the bonding pads on semiconductor dice placed in the jig 20 of FIG. 2a;

DETAIL DESCRIPTION

Figure 1A:
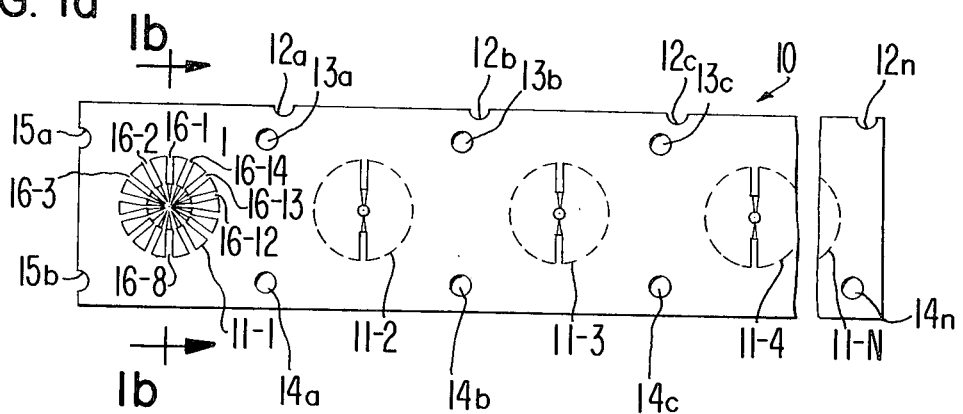
FIGS. 1a through 1d show plan and top views of two lead configurations suitable for use in this invention.

A set of leads 10 — placed in what is called a lead frame strip — suitable for use with this invention is shown in FIG. 1a. Strip 10 contains N groups of leads 11-1 through 11-N, where N is a selected integer. Typically N is 10 although N can have other values as desired. However, when the number of lead groups in the strip becomes large, distortions introduced by the processing required to form the lead groups makes the dimensional accuracy of the strip less controllable. For convenience, this invention will be described using a lead frame strip. However, the groups of leads in each set can be arranged in other configurations so long as the jig in which the dice are placed conforms in configuration to the arrangement of the lead set. Thus groups of leads placed in square, rectangular or polar arrays, for example, are also appropriate for use with this invention. While this invention will be described in terms of each group of leads in a set containing 14 leads, other numbers of leads can also be used in each group.

Figure 1B:
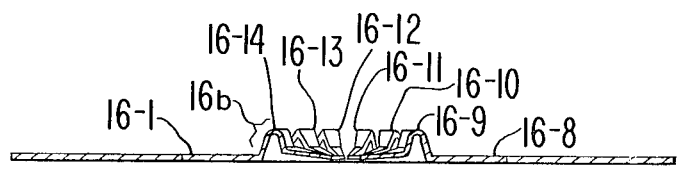

As shown in FIG. 1a, each group of leads 11-n in strip 10 has 14 leads. n is an integer given by 1 ≤ n ≤ N. As shown by lead group 11-1, leads 16-1 through 16-14 are equally spaced around the circumference of a circle. FIG. 1b shows this lead group in cross-section. As shown with lead 16-1, a U-shaped bend 16b provides a relaxation joint for relief of thermal stresses. Bend 16b rises above the plane of the lead strip and allows the lead to contract or expand without unduly stressing the bond formed between the lead and the corresponding bonding pad on the die.

Figure 1C:
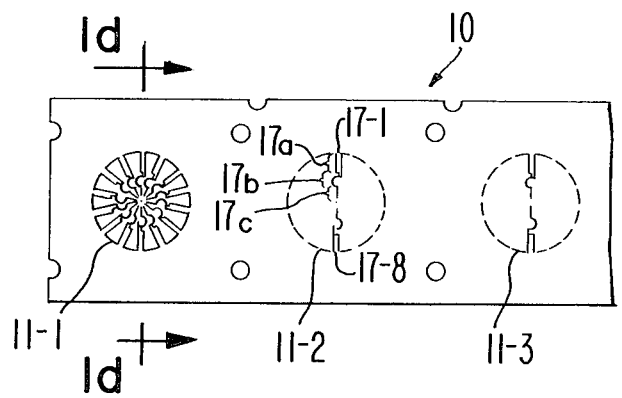
Figure 1D:

FIGS. 1c and 1d show an alternative technique for relieving stresses. As shown in lead group 11-2, lead 17-1 contains a U-shaped portion 17b formed in the plane of the lead frame strip. Portions 17b and 17c of each lead 17 are much narrower than section 17a of each lead to facilitate placing of the leads above the bonding pads on a semiconductor die. This structure has some advantages over the structure shown in FIGS. 1a and 1b in that the U-shaped section 17b can be formed simultaneously with the formation of the leads without requiring the bending of a lead after it has been formed. On the other hand, bend 16b — shown in FIG. 1b associated with lead 16-1 — is formed after lead 16-1 has been formed. Bend 16b thus shortens the lead by the amount of material moved out of the plane of the lead strip and also creates stress points in the lead by stretching the material on the outside of each bend and compressing the material on the inside of each bend. This leads to earlier fatiguing of the leads.

Figure 6B:
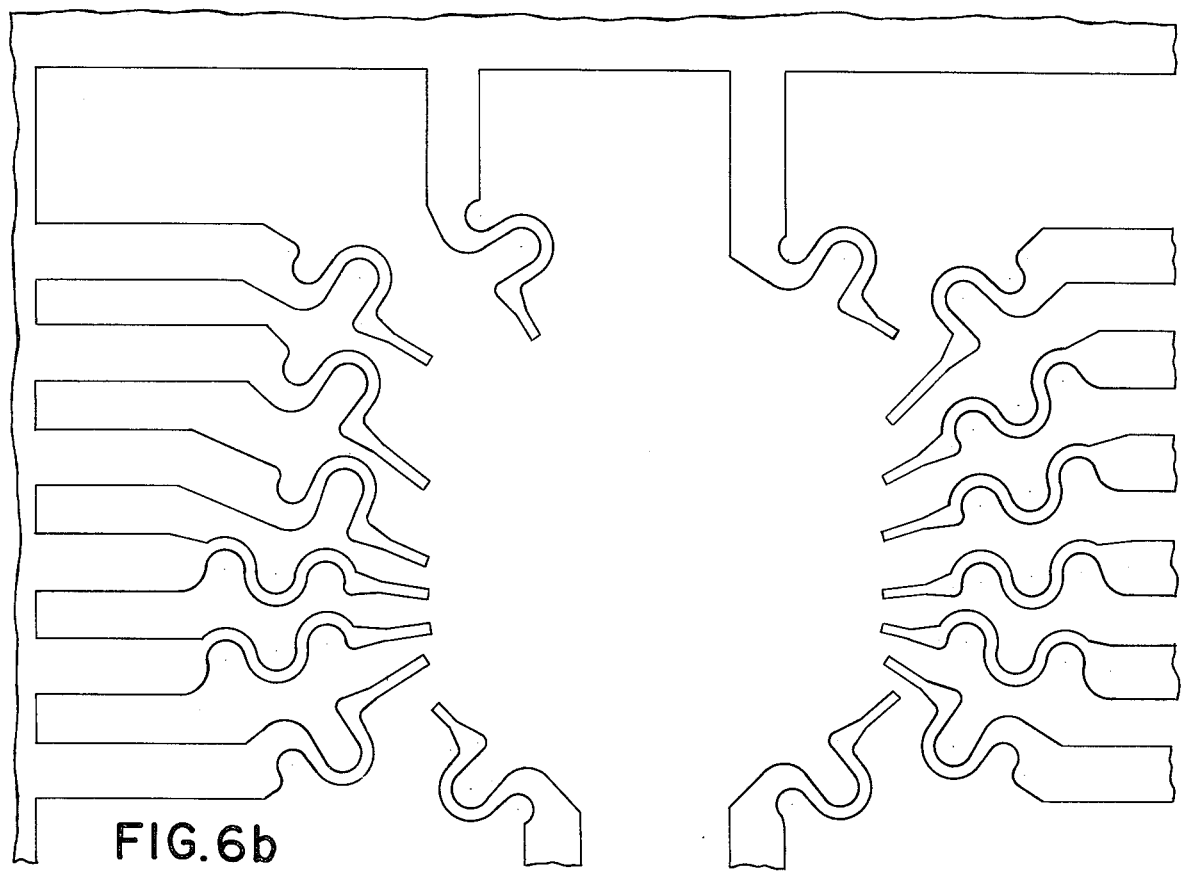
FIGS. 6a and 6b show alternative stress relieving bends in leads appropriate for use with the process and structure of this invention.
Figure 6A:
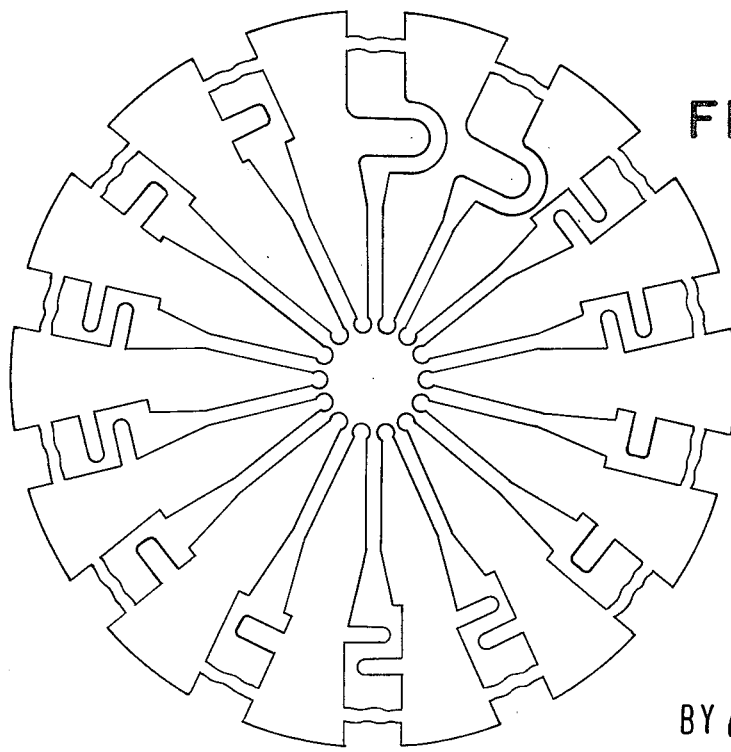

FIGS. 6a and 6b show a number of different lead configurations which can be used to relieve thermal stresses. For illustrative purposes only, the different configurations are shown all formed in one lead group in each figure.

Figure 2A:
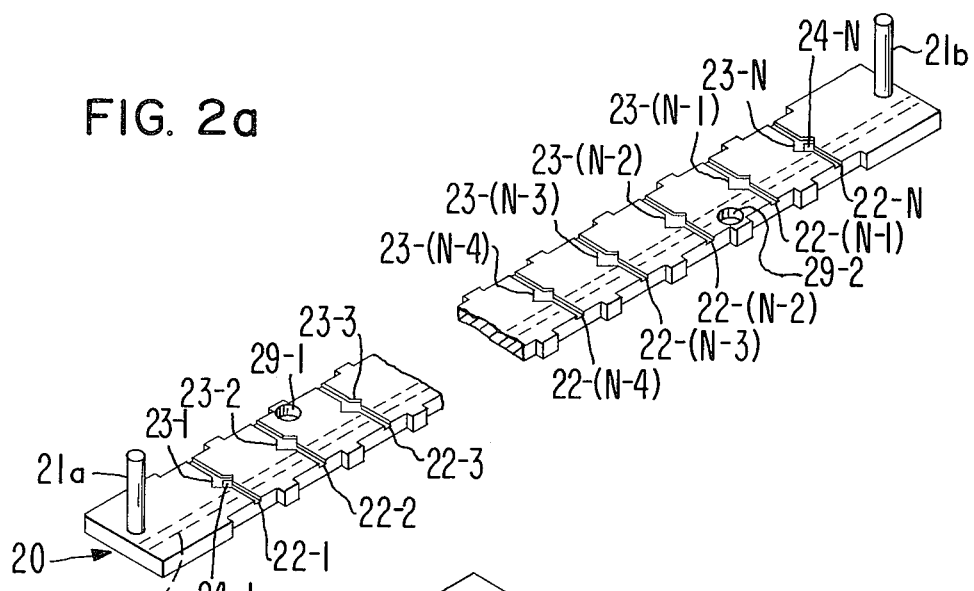
FIG. 2a shows a jig suitable for use in this invention to hold semiconductor dice.
Figure 2B:
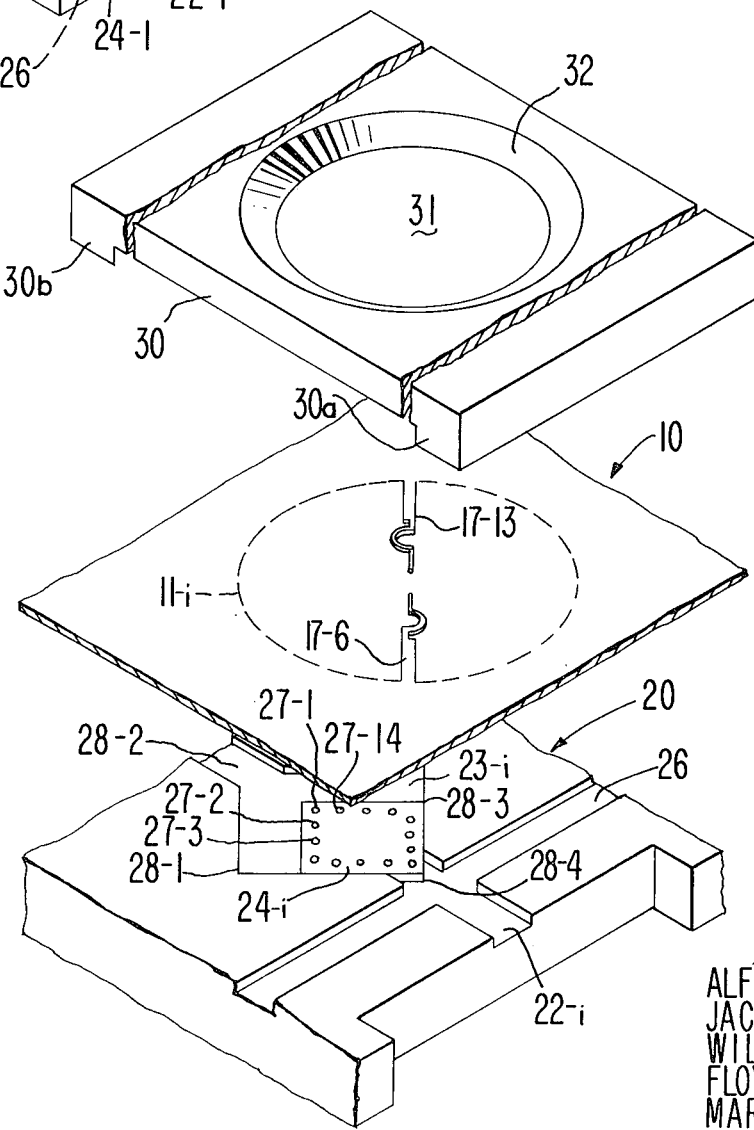
FIG. 2b shows an isometic exploded view of a section of the jig shown in FIG. 2a together with a group of leads from a lead set and a weight to be placed on the lead group.

FIG. 2a shows a jig suitable for use with a lead frame strip according to the principles of this invention. Jig 20 contains a plurality of receptacles 23-1 through 23-N which could be, for example, pins, hollows, slots, or flat-bottomed rectangular depressions, for receipt of a corresponding plurality of semiconductor dice 24-1 through 24-N. Shown as flat-bottomed rectangular depressions, each receptacle is oriented so that two of the corners (corners 28-1 and 28-3, FIG. 2b) of the receptacle fall on the longitudinal axis of the jig while the remaining two corners (corners 28-2 and 28-4, FIG. 2b) of each receptacle fall on a line perpendicular to this axis. These latter two corners are actually removed by thin channels 22-1 through 22-N formed perpendicular to the longitudinal axis of the jig and to the same depth as the receptacles. Channels 22-1 through 22-N allow removal of any small dirt particles which may fall into the receptacles. Semiconductor dice 24-1 through 24-N are placed in the receptacles, bonding pads up, and then are moved, typically by vibrating the jig, into one selected corner of the receptacle. Optionally, a longitudinal channel 26 of the same depth as receptacles 22-1 through 22-N can be formed, as shown by the dashed lines, to the same depth as cross channels 22-1 through 22-N.

Holes 29-1 and 29-2 in jig 20 are designed to receive two pilots on an aligning tool. The inside diameters of holes 29-1 and 29-2 are considerably larger than the outside diameters of the pilots thereby allowing the pilots to move within these holes without moving jig 20.

Figure 2C:
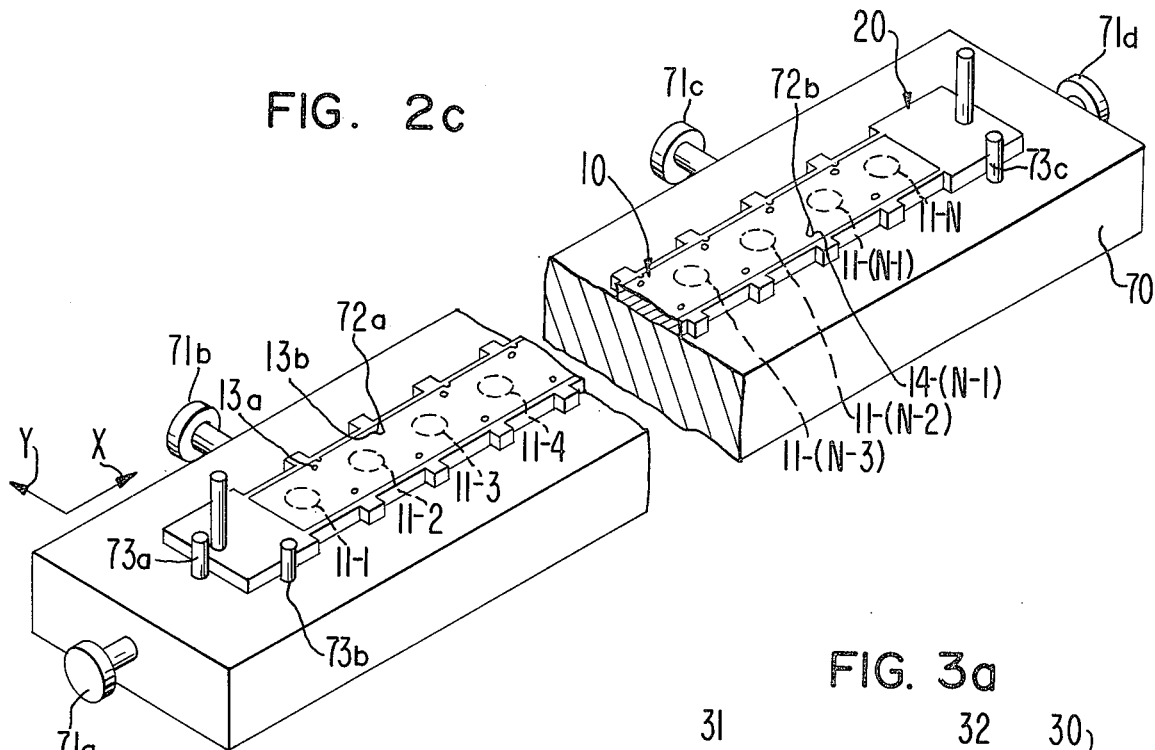

Once the semiconductor dice have been placed in receptacles 23-1 through 23-N and all similarly oriented, a lead frame strip 10, such as the strip shown in either of FIGS. 1a and 1c, is placed over jig 20. As shown schematically in FIG. 2b, the leads 17-1 through 17-14 in one lead group are oriented above bonding pads 27-1 through 27-14 on a corresponding underlying semiconductor die 24-i. Strip 10 is placed directly over the dice. Then jig 20 with strip 10 thereon is placed on alignment tool 70 (FIG. 2c). Jig 20 is held against stops 73a, 73b and 73c. Pilots 72a and 72b protrude through holes 29-1 and 29-2 in jig 20 and through corresponding smaller diameter holes 13b and 14(N-1) in strip 10. An operator moves pilots 72a and 72b by turning knobs 71a, 71b, 71c and 71d to align properly each group of leads 11-1 through 11-N with the bonding pads on the corresponding semiconductor dice contained in jig 20. Once pilots 72a and 72b have been properly positioned to secure this alignment, all subsequent lead frame strips placed on jig 20 will be properly aligned with respect to the underlying semiconductor dice of the same type when jig 20 is placed in aligning tool 70. Periodic checks by an operator can verify this alignment.

After the lead frame strip 10 has been aligned with the semiconductor dice held by jig 20, weights 30 (FIG. 2b) are placed over the lead frame strip to hold the leads firmly against the underlying bonding pads on the semiconductor dice. Typically weight 30 contains an opening 31 with a beveled edge 32 to prevent shadows from hindering a visual check of the alignment of the leads with the underlying bonding pads. Flanges 30a and 30b on weight 30 center this weight on, and prevent this weight from sliding off, lead strip 10.

Figure 3A:
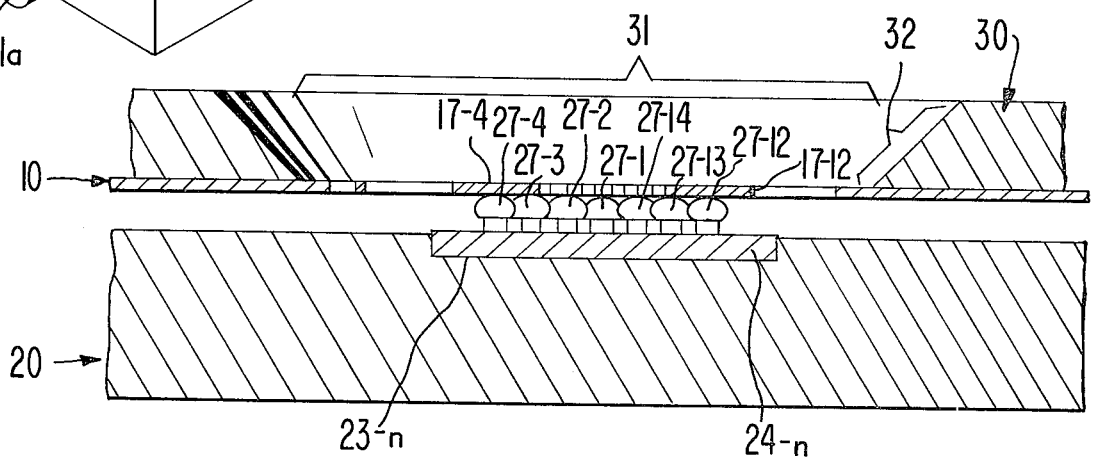
FIGS. 3a and 3b show in cross-section a portion of jig 20 (FIG. 2a) containing a semiconductor die, leads placed above this die and a weight on the leads.

FIG. 3a shows in cross-section the $n^{th}$ section of jig 20 containing die 24-n. Shown on die 24-n are combination bonding pads and solder bumps 27-1 through 27-14. The solder bumps are preferably of the type disclosed in U.S. Pat. No. 3,480,412 issued Nov. 25, 1969, to E. F. Duffek Jr. and I. A. Blech, and assigned to Fairchild Camera and Instrument Corporation, the assignee of this invention. The bump disclosed in the Duffek et al patent contains a hard pedestal on which is formed a selected solder. The hard pedestal prevents the die from collapsing onto the leads or vice versa during the soldering of the leads to the die. Without the hard pedestal, as the solder melts, the leads would be forced by the weight to the surface of the die. This would lead to possible short circuits and failures. The hard pedestal ensures that the leads, such as leads 17-4 and 17-12 shown in cross-section in FIG. 3a, are held a carefully controlled distance above the surface of the die throughout the soldering process. As shown in FIG. 3a, leads 17-4 and 17-12 are pressed against the tops of bumps 27-4 and 27-12. Similar leads (unnumbered for simplicity) are shown on the tops of bumps 27-1, 27-2, 27-3, 27-13 and 27-14. Weight 30 presses against the roots of leads 17 and the structural rigidity of leads 17 is such that these leads are held firmly against the tops of the bumps.

Figure 3B:
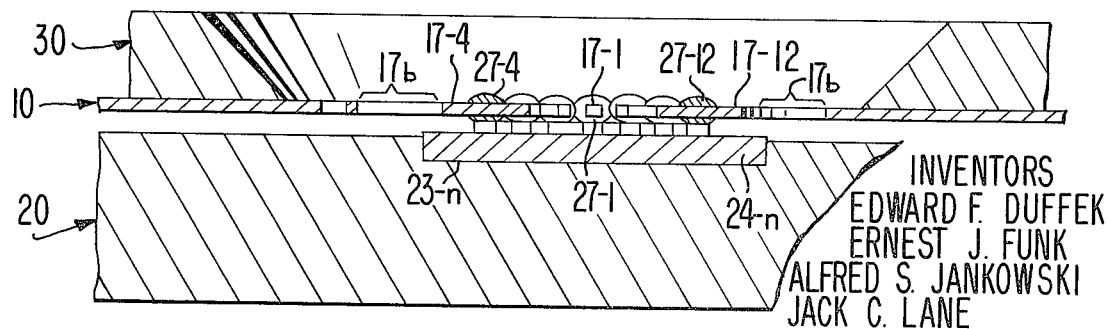

FIG. 3b shows leads 17-4 and 17-11 after the soldering process. Solder on top of bump 27-4 has melted and wet the surface of lead 17-4. This solder runs along the surface of lead 17-4 preventing wet solder from dropping onto the surface of the die. When this solder solidifies, a firm bond is formed between the solder — which ideally surrounds one whole portion of the lead — and the lead. The U-shaped bend 17b in lead 17-4 expands to absorb the stresses induced by the cooling following the soldering operation. Weight 30 has ensured that leads 17 are firmly pressed against bumps 27 throughout the soldering operation.

It should be noted that it is not essential that the tips of the leads in each lead group fall directly over the bonding pads on a die. Rather, so long as the bonding pads on the dice are properly aligned along the radii occupied by the leads, a given lead strip can be used with a range of semiconductor die sizes. All that is required is that some portion of the lead between U-shaped bend 17b in the lead and the tip of the lead contact the underlying bonding pad. Thus a given jig and lead frame strip are to some extent universal, capable of being used with a variety of die sizes. Furthermore, the rectangularly-shaped receptacles 23 in jig 20 will accommodate a wide variety of different die sizes. Thus only a small number of different lead frame strips need be used with the jig of this invention to accommodate widely different die sizes.

Figure 4A:
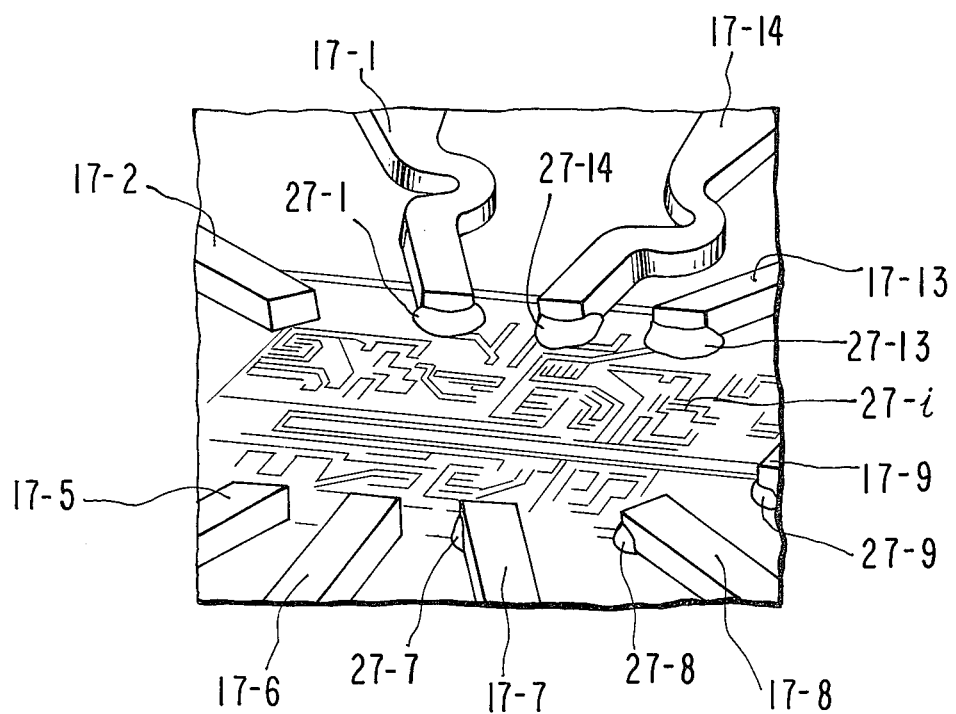
FIG. 4a shows a semiconductor die with leads attached by the process of this invention.

FIG. 4a shows a semiconductor die with leads 17 attached to the die by means of solder bumps. Leads 17-1 through 17-14 are firmly attached to bumps 27-1 through 27-14. It should be noted that the tip of lead 17-2 extends beyond bump 27-2 (not shown) and thus this lead is attached to its bump somewhere between its tip and the U-shaped bend. Leads 17 extend from the chip and when separated from the lead frame in which they are held, will remain cantilevered beyond the edge of the semiconductor die. Thus the die, with the leads attached, is a die with extended (i.e., cantilevered) leads attached thereto. The material of the leads can be any electrically conductive material desired which is compatible with the underlying metallurgy of the semiconductor die and with the package materials.

As shown in FIG. 4a, package leads 17 are attached to the semiconductor die through solder bumps 27. The surface of the die is typically protected with vapox, a vapor deposited silicon oxide layer. The solder bump metallurgy is such that only a very small amount of aluminum is not covered either with solder or vapox. Hence the opportunity for package failure due to corrosion of aluminum is greatly reduced using the packaging technique and structure of this invention over prior art packaging techniques and structures.

Carrying out of the soldering operation in an inert atmosphere minimizes oxidation of the lead surfaces and thus ensures excellent wetting of these surfaces by the solder. Surface oxides impede such wetting. Leads 17 have a high pull strength, pull strengths two to three orders of magnitude higher than with prior art wire bonds being common. This bond makes an excellent electrical contact.

Figure 5A:
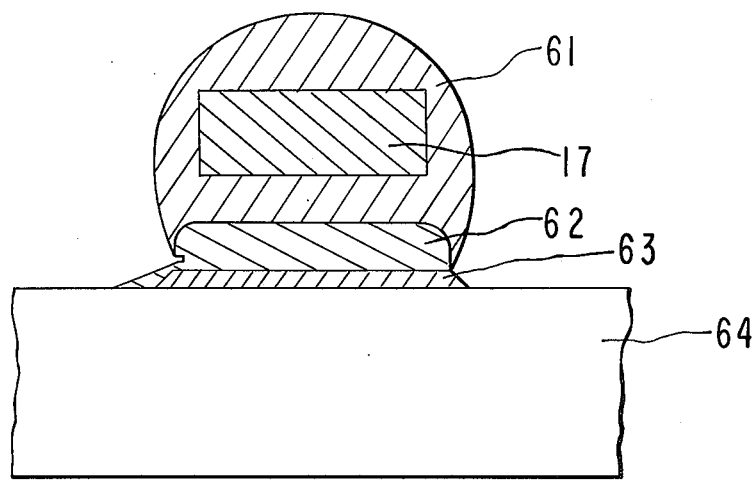
FIGS. 5a to 5c show typical cross-sections of solder connections to leads obtained using the process of this invention.
Figure 5B:
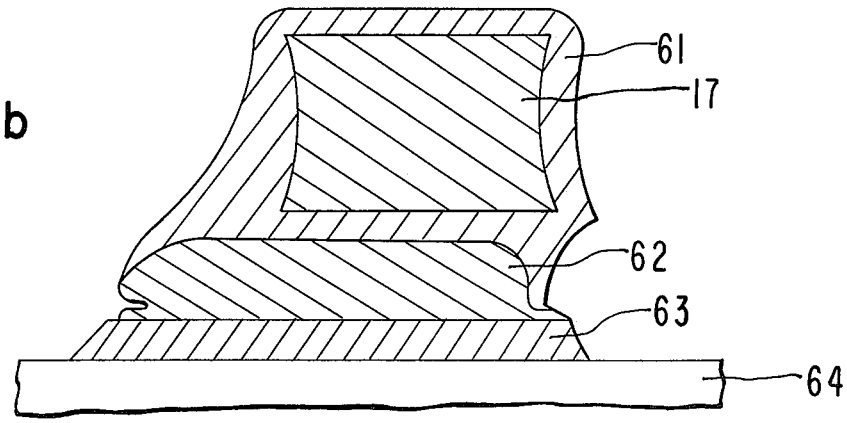
Figure 5C:
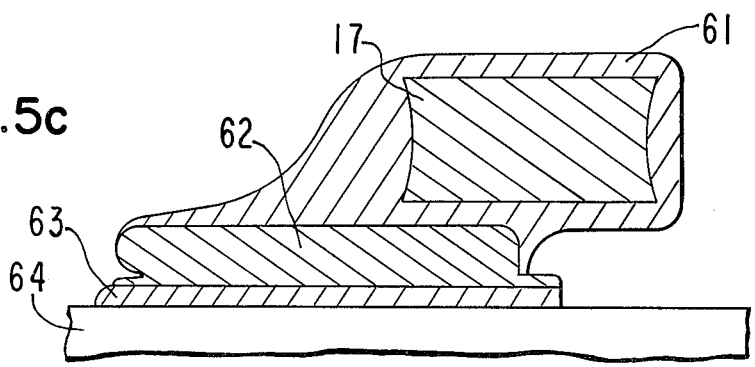

FIGS. 5a through 5c shows in cross section several of the bonds produced using the method of this invention. A portion of lead 17 is completely surrounded, as shown in FIG. 5a, by solder 61. This solder has melted and wet the surfaces of the lead and run along the lead to form the bond with the lead. Solder 61 rests on a nickel barrier layer 62 which in turn is formed on an aluminum pedestal 63. The aluminum 63 makes contact with the underlying region of a semiconductor device. As shown in FIGS. 5a through 5c, only a very small portion of aluminum 63 is visible, the remaining exposed structure comprising solder, nickel or insulation on the top surface of the semiconductor die. FIGS. 5b and 5c show the resulting structure when lead 17 is slightly misaligned with the underlying bump and when lead 17 is drastically misaligned with the underlying bump, respectively. As shown in FIG. 5c, drastic misalignment still does not prevent the solder from flowing around the lead thereby forming a strong mechanical bond and good electrical contact with the lead.

Figure 4B:
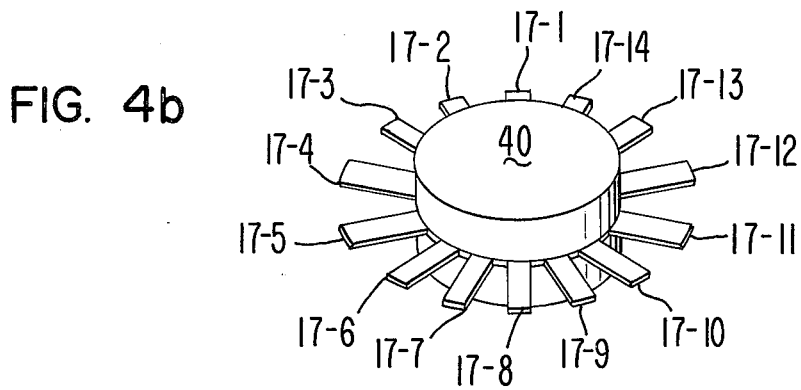
FIG. 4b shows the semiconductor die and attached leads of FIG. 4a encapsulated in a first package.

FIG. 4b shows a package 40 formed around semiconductor die 24-n bonded to lead group 11-n. In this case, the leads shown protruding from package 40 are leads 17-1 through 17-14 shown in FIG. 1c. This package is typically formed in a transfer molding operation using a plastic. Junction coating is usually, though not necessarily, applied to the semiconductor die prior to the transfer molding operation to protect the die.

Figure 4C:
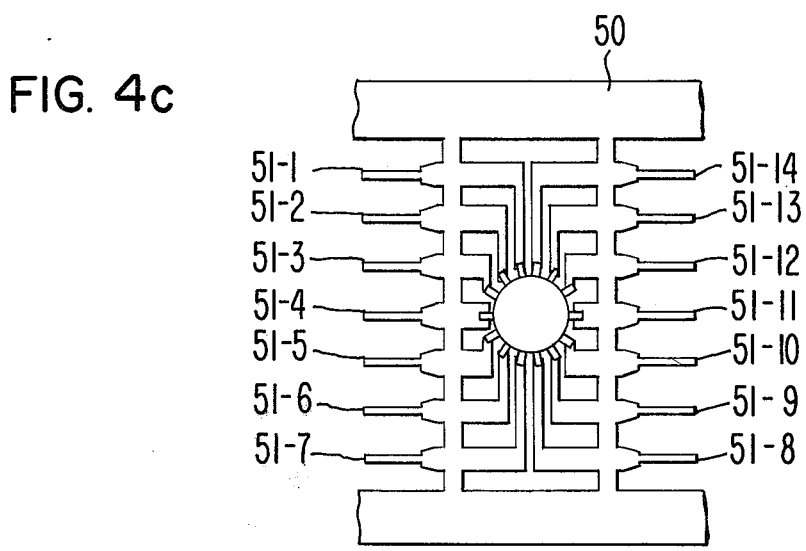
FIG. 4c shows the package of FIG. 4b connected to a second set of leads.

The small package of FIG. 4b, typically called a "pill", can be used as it is, or alternatively, bonded, as shown in FIG. 4c, to leads contained in a larger lead frame of the type used in the so called dual-in-line or "dip" package. When used with the dip package, the leads 17-1 through 17-14 protruding from package 40 are attached (a wide variety of ways, ranging from mechanical bonds to solder joints and combinations of these, can be used to carry out this attachment) to corresponding leads 51-1 through 51-14 contained within lead frame strip 50. Next, the pill package is further encapsulated so as to cover the pill and leads 17-1 through 17-14 protruding from the pill with a second packaging material, again typically another plastic. The resulting package 60, shown in FIG. 4*d*, has seven leads protruding from each side. These leads can be bent and the strip connecting adjacent leads removed so as to form the familiar dip package.

While several embodiments of this invention have been shown, it should be understood that other embodiments incorporating the principles of this invention will be obvious in view of this disclosure. In particular, embodiments using leads with other shapes as shown in FIGS. 6*a* and 6*b* to prevent thermal stresses from being induced in the bonds to the semiconductor die will be obvious in view of this disclosure.

Figure 4D:
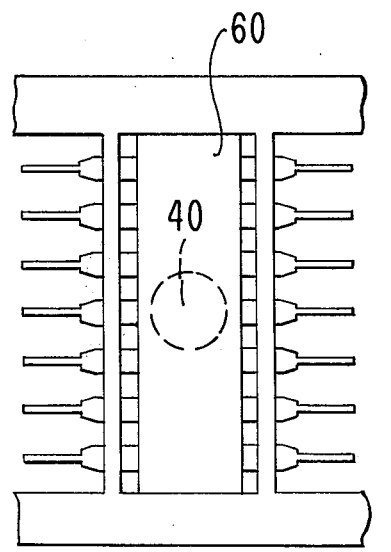
FIG. 4d shows a second package formed around the first package shown in FIG. 4c to yield the familiar dual in-line package.

Furthermore, the semiconductor die with leads attached as shown in FIG. 4*a* can be encapsulated directly into the dual-in-line package shown in FIG. 4*d* if desired without use of the intermediate pill package shown in FIG. 4*b*.

What is claimed is:

1. A semiconductor device which comprises:
   a semiconductor die containing on one face thereof a plurality of solder bumps;
   a corresponding plurality of electrically-conducting first leads attached to and held on the face of said die by said solder bumps, each lead containing a selectively shaped bend therein in a portion of the lead beyond the solder bump, said bend relieving thermal stresses induced in said lead;
   first packaging material surrounding said semiconductor die and said leads to beyond said bends thereby providing a package for said semiconductor die from which protrude selected portions of said first leads;
   a second group of leads attached on a one-to-one basis to said selected portions of said first leads protruding from said package, and
   second packaging material surrounding and contacting on all exposed surfaces said first packaging material and covering all of the exposed surfaces of said first group of leads and portions of each lead in said second group.

* * * * *